US010142095B2

(12) United States Patent
Nayyar et al.

(10) Patent No.: US 10,142,095 B2
(45) Date of Patent: Nov. 27, 2018

(54) TIMING FOR IC CHIP

(71) Applicant: TEXAS INSTRUMENTS INCORPORATED, Dallas, TX (US)

(72) Inventors: Jasbir Singh Nayyar, Distt Ludhiana Punjab (IN); Brian Ginsburg, Allen, TX (US); Karthik Subburaj, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/334,979

(22) Filed: Oct. 26, 2016

(65) Prior Publication Data

US 2018/0115409 A1    Apr. 26, 2018

(51) Int. Cl.
*H04L 7/00* (2006.01)
*H01Q 1/22* (2006.01)

(52) U.S. Cl.
CPC ......... *H04L 7/0087* (2013.01); *H01Q 1/2283* (2013.01)

(58) Field of Classification Search
CPC ..... H04L 7/0337; H04L 7/0334; H04L 7/033; H04L 7/0029; H04L 7/0008; H04L 7/02; H04L 7/0331; H03L 7/091
USPC .......................... 375/355, 354, 316, 219, 295
See application file for complete search history.

(56) References Cited

U.S. PATENT DOCUMENTS

| | | | |
|---|---|---|---|
| 7,246,185 B1 | 7/2007 | Pritchard et al. | |
| 9,204,312 B2 | 12/2015 | Sinha et al. | |
| RE46,021 E | 5/2016 | Mayer | |
| 2004/0221085 A1 | 11/2004 | Bee et al. | |
| 2004/0225814 A1 | 11/2004 | Ervin | |
| 2005/0068217 A1* | 3/2005 | Tsujita | H03M 1/066 341/155 |
| 2005/0229066 A1 | 10/2005 | Wolff et al. | |
| 2006/0058035 A1 | 3/2006 | Tsuruno | |
| 2009/0172242 A1 | 7/2009 | Piasecki | |
| 2009/0323880 A1* | 12/2009 | Filer | H04J 3/0685 375/376 |
| 2015/0153445 A1 | 6/2015 | Jansen | |
| 2016/0124881 A1 | 5/2016 | Zhang et al. | |
| 2016/0294591 A1 | 10/2016 | Kurchuk et al. | |
| 2017/0102452 A1* | 4/2017 | Lilburn | G01S 7/32 |

OTHER PUBLICATIONS

International Search Report and Written Opinion dated Feb. 14, 2018 in PCT/US2017/058621 (8 pages).

* cited by examiner

*Primary Examiner* — Zewdu Kassa
(74) *Attorney, Agent, or Firm* — Gregory J. Albin; Charles A. Brill; Frank D. Cimino

(57) ABSTRACT

A integrated circuit (IC) chip can include a root timer that generates a frame pulse based on a start trigger signal. The IC chip can also include a hardware clock control that provides a clock signal based on a selected one of the frame pulse and the synchronization signal provided from one of the root timer and another IC chip. The IC chip can further include a plurality of analog to digital converters (ADCs). Each of the plurality of ADCs being configured to sample an output of a respective one of a plurality of radio frequency (RF) receivers based on the clock signal.

21 Claims, 8 Drawing Sheets

TIMING FOR IC CHIP

TECHNICAL FIELD

This disclosure relates to an integrated circuit (IC) chip. More particularly, this disclosure relates to an IC chip that generates timing for controlling sampling of radio frequency (RF) receivers.

BACKGROUND

A clock signal is a particular type of signal that oscillates between a high and a low state. Although more complex arrangements are used, the most common clock signal is in the form of a square wave with a 50% duty cycle, usually with a fixed, constant frequency. Circuits using the clock signal for synchronization may become active at either the rising edge, falling edge, or, in the case of double data rate, both in the rising and in the falling edges of the clock cycle. Clock signals are used to coordinate actions of components in digital circuits. A clock signal is produced by a clock generator. As one example, radar systems use clock signals to synchronize operation of transmitters, receivers and other components.

SUMMARY

An integrated circuit (IC) chip is disclosed. The IC chip can generate a clock signals to control operation of various components within the IC chip as well as within other IC chips.

One example relates to an integrated circuit (IC) chip that can include a root timer that generates a frame pulse based on a start trigger signal. The IC chip can also include a hardware clock control that provides a clock signal based on a selected one of the frame pulse and the synchronization signal provided from one of the root timer and another IC chip. The IC chip can further include a plurality of analog to digital converters (ADCs). Each of the plurality of ADCs being configured to sample an output of a respective one of a plurality of radio frequency (RF) receivers based on the clock signal.

Another example relates to an IC chip that can include a microcontroller that generates a software trigger signal and a trigger selector that receives the software trigger signal and selects a synchronization signal to provide a start trigger signal. The IC chip can also include a root timer that generates the synchronization signal based on the start trigger signal. The synchronization signal can be provided to a synchronization output port of the IC chip that is coupled to a synchronization input port of the IC chip. The IC chip can further include a hardware clock control that provides a clock signal based on the synchronization signal received at the synchronization input port. The IC chip can still further include a plurality of ADCs that are each configured to sample an output of a respective one of a plurality of receivers based on the clock signal.

Yet another example relates to a radar system that can include a radar controller that processes radar data to determine a location of an object. The radar system can also include a master radar integrated circuit (IC) chip. The master IC chip can be configured to sample a plurality of received RF signals at predetermined instances. A timing of the sampling is based on a synchronization signal generated by the master IC chip. The master IC chip can also perform a plurality of software operations based on timing corresponding to the synchronization signal. The radar system can further include one or more slave IC chips. Each of the one or more slave IC chip can be configured to sample a plurality of received RF signals at predetermined instances. A timing of the sampling can be based on the synchronization signal generated by the master IC chip. Each slave IC chip can also be configured to perform a plurality of software operations based on timing corresponding to the synchronization signal.

DETAILED DESCRIPTION

An integrated circuit (IC) chip can be programmed/set to operate in a single mode, a master mode or a slave mode. The IC chip includes features for controlling modules including Analog-to-Digital Converters (ADCs) that sample radio frequency (RF) receivers that need a relatively high degree of synchronization (e.g., within 10 nanoseconds). The IC chip can also control the operation of software functions (e.g., calibration and built-in self-tests (BISTs)) that need synchronization within a timing of about 10 microseconds.

In the single mode, the IC chip can control its own timing operations. In the master mode, the IC chip can be employed to generate a synchronization signal that is provided to one or more IC chips operating in slave mode. The synchronization signal can be employed to generate a "root" trigger (e.g., a frame pulse) that can in-turn be employed to generate one or more "leaf" triggers that are employed to control the timing of modules (e.g., the ADCs) operating on the IC chip. Additionally, the root trigger can be employed by a processing unit (e.g., a microcontroller) to control the operation of software functions. In this manner, the same IC radar chip design can be employed in a single IC chip solution or in a multiple IC chip solution. In many examples herein, the timing is disclosed in the context of coordinate actions of components implemented in one or more radar IC chips. The approach disclosed herein, however, is applicable to other types of IC chips such as to provide inter-chip synchronization.

Figure 1:
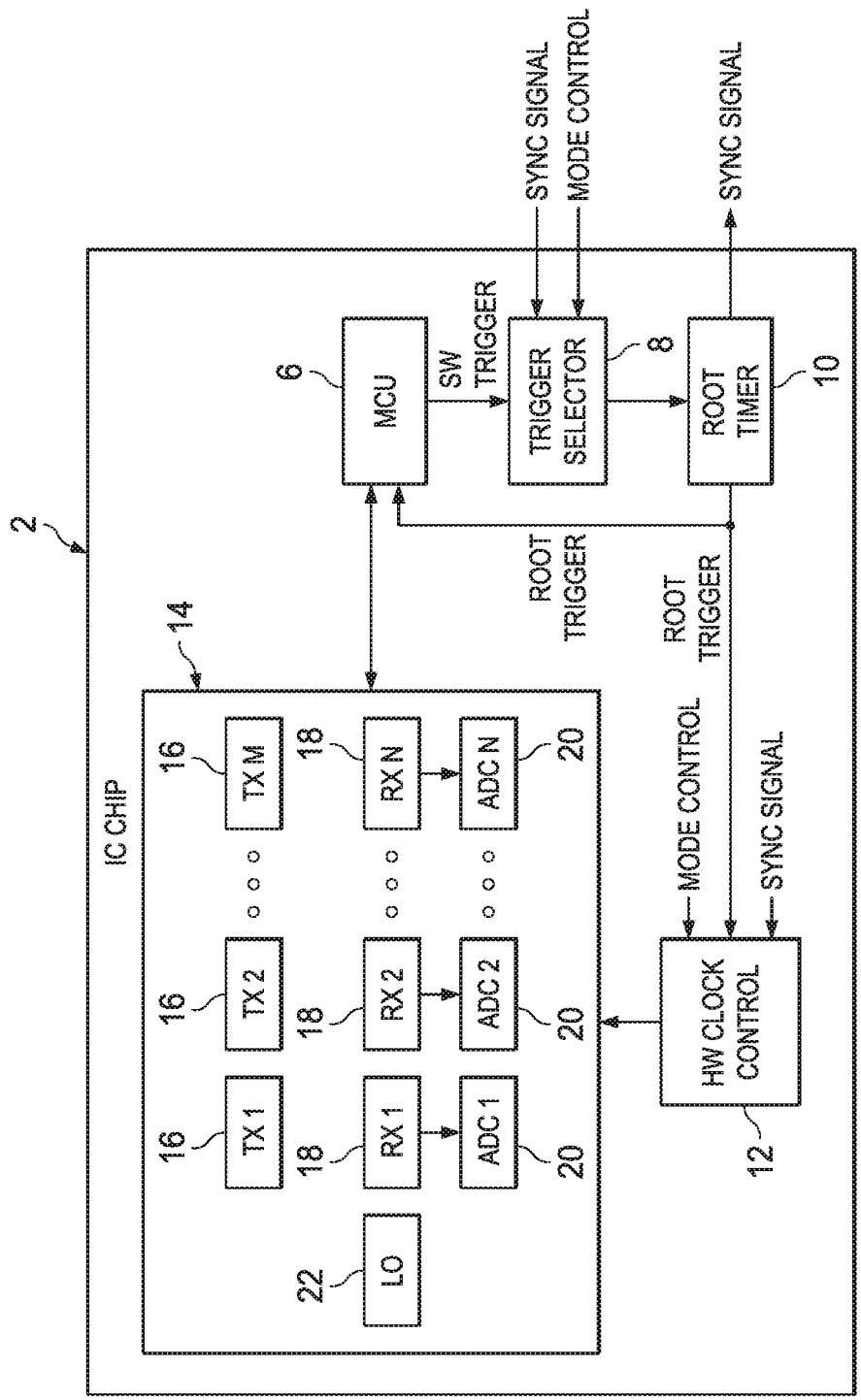
FIG. 1 illustrates a diagram of an example of an integrated circuit (IC) chip.

FIG. 1 illustrates a block diagram of an example of an IC chip 2. The IC chip 2 could be employed for example, in a radar system. In such a situation, the IC chip 2 can be implemented in an automotive detection system that employs radar, such as in a collision avoidance system, automatic lane shifting system, automatic cruise control system, etc. As explained herein, the IC chip 2 can be implemented in a single IC chip 2 solution, or can be in communication with one or more additional IC chips 2 that operate in a similar manner.

The IC chip 2 can include modules for performing certain operations of the IC chip 2. Moreover, although the modules of the IC chip 2 are described as performing certain radar-related functions, it is to be understood that in other examples, different modules can perform other functions than that which is described herein.

The IC chip 2 can include a microcontroller unit (MCU) 6. The MCU 6 can include a processor core configured to execute machine readable instructions stored in a non-transitory machine readable medium. The medium could be embedded in the MCU 6 or could be external to the MCU 6. In some examples, the MCU 6 can operate as a digital signal processor (DSP).

The IC chip 2 has a system clock that is a signal of known frequency. The system clock can be used directly or indirectly after division or multiplication by digital hardware circuits and processors in the chip. In some examples, the system clock may be generated within the IC chip 2 (e.g., locally), such as by an Oscillator or Phase Lock Loop. Alternatively, in other examples, the system clock may be received from an external source at an input pin of the IC chip 2.

The IC chip 2 can be set to operate in any of a plurality of modes, such as may include a single mode, master mode or slave mode. The IC chip 2 can include a trigger selector 8 that can be controlled by a mode control signal (labeled in FIG. 1 as "MODE CONTROL"). The trigger selector 8 could be, for example a multiplexer. Moreover, the mode control signal could be generated locally (e.g., by the MCU 6) or the mode control signal could be provided from an external source (e.g., a radar controller). In still other examples, the mode control signal can be controlled by an input pin of the IC chip 2.

In situations where the IC chip 2 is operating in the single mode, the MCU 6 can provide the trigger selector 8 with a software trigger that can be generated by software executing on the MCU 6. The software trigger can be passed to a root timer 10 that can generate a root trigger (e.g., a frame pulse) in response to the software trigger. In such a situation, the root trigger can be a passed-through version (e.g., delayed or non-delayed) of the software trigger. The root trigger can be provided to a hardware clock control 12 and back to the MCU 6. In response, the hardware clock control 12 can generate leaf timers (timers that are slaves to the root trigger generated by the root timer 10) that can control operation of components of a transceiver 14 and/or other circuits of the IC chip 2 or external circuits. The hardware clock control 12 can be formed of discrete circuit components (e.g., timers, digital logic gates, transistors and switches) that can generate and control timing signals.

The transceiver 14 can include M number of transmitters 16, where M is an integer greater than or equal to one. Additionally, the transceiver 14 can include N number of receivers 18, where N is an integer greater than or equal to one. In some examples, there can be more receivers 18 than transmitters 16 (or vice versa). For instance, the transceiver 14 can include three (3) transmitters and four (4) receivers. In some examples, there can be an equal number of receivers 18 and transmitters 16. Each transmitter 16 can be coupled to a transmitting antenna that can emit a radio frequency (RF) signal at a specific frequency in a frequency band. Additionally, each receiver 18 can be coupled to a receiving antenna that can detect an RF signal that is within a frequency band. In some examples, the frequency band of the M number of transmitters 16 and the N number of receivers 18 can range from about 80 gigahertz (GHz) to about 81 GHz. In other examples, different frequencies could be employed, such as frequencies of about 76 GHz.

The transceiver 14 can include components, such as a local oscillator (LO) 22 to facilitate generation of the signal transmitted by the transmitters 16. The transceiver 14 can also include N number of analog to digital converters (ADCs) 20 coupled to a respective (matched) receiver 18. Each ADC 20 can be configured to sample a signal received by a corresponding receiver 18. Stated differently, the second ADC 20 (labeled in FIG. 2 as "ADC 2") can be configured to sample RF signals detected by the second receiver 18 (labeled in FIG. 1 as "RX 2"). Each ADC 20 can sample the RF signals detected by the respective receiver 18 at a predetermined clock rate. In some examples, the predetermined clock rate can be approximately 1.8 GHz, and in other examples, a higher or lower sampling rate can be employed.

In the single mode, based on the root trigger, the hardware clock control 12 can control the time periods that the transmitters 16 transmit RF signals, and the frequency that the transmitters 16 transmit the RF signals (via the LO 22). Further, the hardware clock control 12 can control the time at which the receivers 18 receive incoming RF signals. Additionally, the hardware clock control 12 can control a time at which each of the ADCs 20 samples the RF signal detected by the corresponding receiver 18. That is, the hardware clock control 12 can control the duration and order of operations of components on the IC chip 2.

The sample RF signals can be provided to the MCU 6. The MCU 6 can process the sampled RF signals in a radar chirp to derive data indicating a presence (or absence) of a detected object in an automotive detection system. In some examples, the MCU 6 can make a determination as to the location of the object. Additionally or alternatively, the MCU 6 can provide data to an external system (e.g., the radar controller) to collaborate data from multiple IC chips 2 to determine the location of the object for the automotive detection system.

The root timer 10 can also provide the root trigger to the MCU 6. In response, a software module (e.g., a software processor timing module) in the MCU 6 can control the scheduling of software operations and/or hardware tests. For instance, the MCU 6 can schedule calibration tests for each of the M number of transmitters 16 and N number of receivers 18. In such a situation, the MCU 6 can ensure that at any given time, only a particular set of transmitters 16 and/or receivers 18 are being calibrated, thereby avoiding unintentional interference. Additionally, the MCU 6 can employ the root trigger to determine a time to execute a built-in-self test (GIST), radar chirps or the like.

In single mode, operations controlled by the hardware clock control 12 can be synchronized within a "tight window". As used herein, the term "tight window" indicates that the operations occur at in a pre-defined time, with an uncertainty of about 0.3 ns around that pre-defined time. Depending on the clock frequencies used in the system, the uncertainty can be up to about 10 ns. Moreover, the software operations controlled by the MCU 6 can be synchronized within a "loose window" of about 10 μs. As used herein, the term "loose window" indicates that the operations occur at a pre-defined time, with an uncertainty, relatively larger than the tight window uncertainty, of up to about 10 μs around that pre-defined time. The terms "tight window" and "loose window" are used multiple times throughout the description of this disclosure with this meaning.

In situations where the IC chip 2 operates in the master mode, the root timer 10 provides a synchronization signal via an output pin thereof to another IC chip 2 (not shown). The other IC chip 2 can be identical to the IC chip 2 but operating in a slave mode in response to the mode control signal. Additionally, in the master mode, the synchronization signal is fed into the hardware clock control 12. As noted, the hardware clock control 12 also receives the mode control signal. In response to the mode control signal being set to MASTER and the synchronization trigger being activated, the hardware clock control 12 controls the transceiver 14 based on the synchronization signal in a manner similar to the method explained with respect to the single mode of operation (which operations are based on the root trigger). Furthermore, in the master mode, the MCU 6 controls the operations of the transceiver (e.g., calibration, BIST, radar chirps or the like).

In situations where the IC chip 2 is operating in the slave mode, the synchronization signal is received at an input of the IC chip from another external IC chip operating in the master mode. The synchronization signal is provided to the trigger selector 8 and the hardware clock control 12. Moreover, the mode control signal, which is set to SLAVE is distributed within the IC chip provided to the trigger selector 8 and the hardware clock control 12. The mode control signal (being set to SLAVE) causes the trigger selector 8 and the hardware clock control 12 to select the synchronization trigger to control the generation of clock signals at the root timer 10 and the hardware clock control 12. For example, a pulse in the synchronization signal can cause the root trigger output by the root timer 10 to reset to align the root trigger with the synchronization signal. Moreover, the hardware clock control 12 and the MCU 6 continue to operate in a manner similar to the single mode and the master mode of operation, wherein the timing is dictated by the synchronization signal. In a multi-chip example, wherein one IC chip 2 is operating in the master mode, and one or more IC chips 2 are operating in the slave mode, the operations of the IC chip 2 operating in slave mode are executed locally (e.g., by components local to the IC chip 2). Moreover, the timing of such operations is controlled by an external source (another IC chip 2) that provides the synchronization signal.

By operating the IC chip 2 in the multi-chip example (with one IC chip 2 operating in the master mode and one or more remaining IC chips operating in the slave modes), inter-chip hardware operations (e.g., the sampling of the ADCs 20) can be synchronized within a "tight window". Additionally, software operations across the multiple IC chips 2 that do need such tight synchronization can be synchronized a within a "loose window" (. Moreover, since the synchronization signal is common among each IC chip 2 there is no need to implement a handshaking procedure (e.g., a procedure for establishing a new channel) between the IC chip 2 operating in the master mode and the remaining ne or more IC chips 2 operating in the slave mode.

As is demonstrated, the same IC chip 2 can be deployed by itself (e.g., single mode) or can be deployed in a multi-chip system (e.g., a multi-chip radar system), where one IC chip 2 operates as a master (in the master mode) and the remaining one or more IC chips operate as slaves (in the slave mode).

Figures 2, 3:
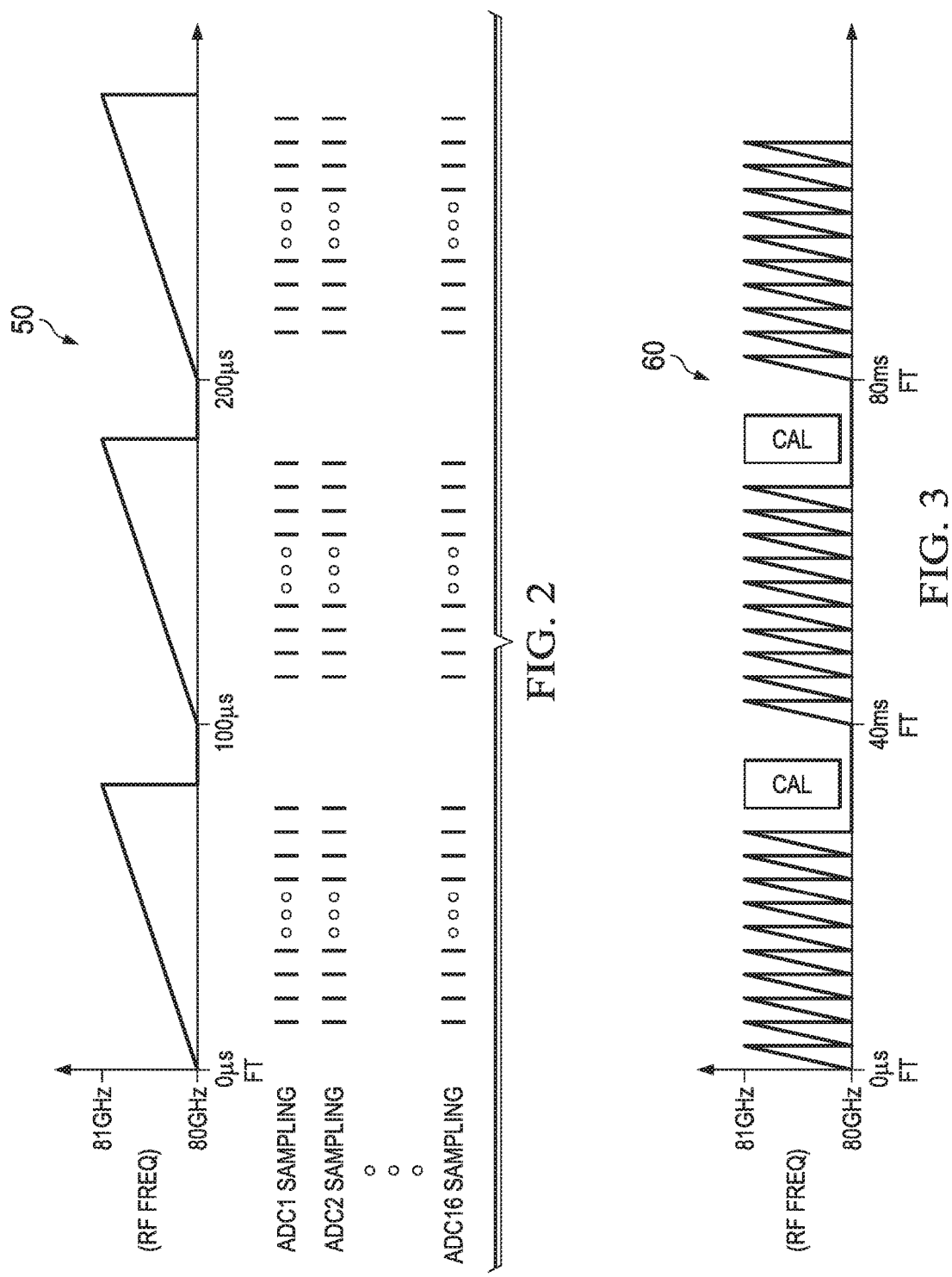
FIGS. 2-3 illustrate timing diagrams for an IC chip.

FIG. 2 illustrates a timing diagram 50 depicting an example of an aligned (synchronized) sampling of hardware ADCs in a multi-chip radar system. FIG. 3 illustrates another timing diagram 60 depicting an example of aligned software timing of radar chips in the multi-chip radar system. In the timing diagrams 50 and 60, it is presumed that there are four (4) IC chips 2 of the type illustrated in FIG. 1, wherein a first radar chip 2 is operating in the master mode, and the second to fourth radar chips 2 are operating in the slave mode. Moreover, it is presumed that each radar chip 2 has four (4) ADCs 20, for a total of sixteen (16) ADCs 20 (corresponding to signals labeled in FIG. 2 as ADC1 . . . ADC16). Thus, reference may be made back to the example IC chip 2 of FIG. 1 in conjunction with the description of FIGS. 2 and 3.

In the example of FIG. 2, the timing diagram 50 plots an output frequency (controlled by the LO 22) of the transmitters 16 as a function of time in microseconds (µs). As is illustrated in the timing diagram 50, the frequency is ramped from 80 GHz to 81 GHz over a time of about 80 µs. Moreover, each of the sixteen (16) ADCs 20 are configured to sample a corresponding receiver within a tight window during each frequency ramp.

The timing diagram 40 illustrates the behavior of RF frequency versus time. In a Frequency Modulated Continuous Wave Radar (FMCW radar) system, the LO 22 generates a signal with a frequency that varies (ramps up or down) linearly in time from 80 GHz to 81 GHz over 90 microseconds (90 µs). One or more of the M number of transmitters 16 illustrated in FIG. 1 can amplify and transmit this signal using antennas. The electromagnetic signals are received using antennas and circuit components present in one or more of the N number of receivers 18 illustrated in FIG. 1. Each of the N number of ADCs 20 illustrated in FIG. 1 sample the output of a corresponding one of the N number of receivers 18. In the timing diagram 50, a time between 0 µs and 100 µs is referred to as one chirp. A radar frame contains a sequence of a plurality of chirps. The properties of the radar frame include a specified number and sequence of chirps and the properties of the radar frame's constituent chirps. The properties of chirp includes information indicating when the LO frequency should start to ramp up or down and for how long, when the transmitters 16 and receivers 18 should be activated and de-activated, when the ADCs 20 should sample the receivers 18 outputs.

As one example of operation of the multi-chip radar system, sampling each the sixteen (16) ADCs 20 at nearly the same time can provide information indicating which receivers 18 of the multi-chip radar system receive a transmitted signal that has been reflected by a detected object (which can be referred to as a reflected signal) and which receivers 18 do not receive a reflected signal. A distance between the object and the multi-chip radar system can be determined, for instance based on the difference in frequency at a time of transmission of the transmitted signal and the time of the sampling of the reflected signal. In particular, the difference in frequencies can be employed to determine a time of flight of the transmission signal and the reflected signal, which in turn can be employed to calculate the distance to the detected object.

In the example of FIG. 3, the timing diagram 60 plots the output frequency as a function of time in milliseconds (ms). For purposes of simplification of explanation, the timing diagrams 50 and 60 plot the same ramp output signal at different scales (µs in timing diagram 50 and ms in timing diagram 60). As is illustrated in the timing diagram 60 of FIG. 3, at specific scheduled time (which can be periodic or asynchronous) a transceiver calibration (labeled in timing diagram 60 as "CAL") is performed. As described, the software executing on each MCU 6 schedules the calibration, the triggering of radar chirps, execution of BISTs (and/or other software operations) in synchronization (e.g., within about 10 µs) to perform mutual calibration, radar chirps and/or BISTs and to avoid unwanted interference between the various IC chips 2.

In each of the timing diagram 50 and 60, a frame trigger (FT) is illustrated. The FT can be an example of a clock edge in a frame pulse. The FT can be provided by the synchronization signal, which can be generated by the root timer 10 of the master IC chip 2 and provided to the three (3) slave IC chips 2. Software operations can be synchronized within about 10 μs across each of the IC chips 2 in the radar system. Thus, by operating the IC chips 2 in the master and slave modes, hardware operations (e.g., the sampling of the ADCs 20) can be synchronized within a tight window while software operations across multiple IC chips 2 that do need such tight synchronization can be synchronized within a loose window. The employment of multiple IC chips 2 allows for beamforming (e.g., with sixteen or more receivers 18). Accordingly, the IC chip 2 can be employed for short or long range radar (e.g., within 10 to 200 meters) detection in an automotive detection system. In other examples, the IC chip 2 can be employed in industrial systems that also need radar with beamforming.

Synchronizing the hardware operations (e.g., sampling of a receiver) as well as the software operations avoids mutual RF interference during self-calibration of the transmitters 16 and the receivers 18 associated with the IC chips 2.

Figure 4:
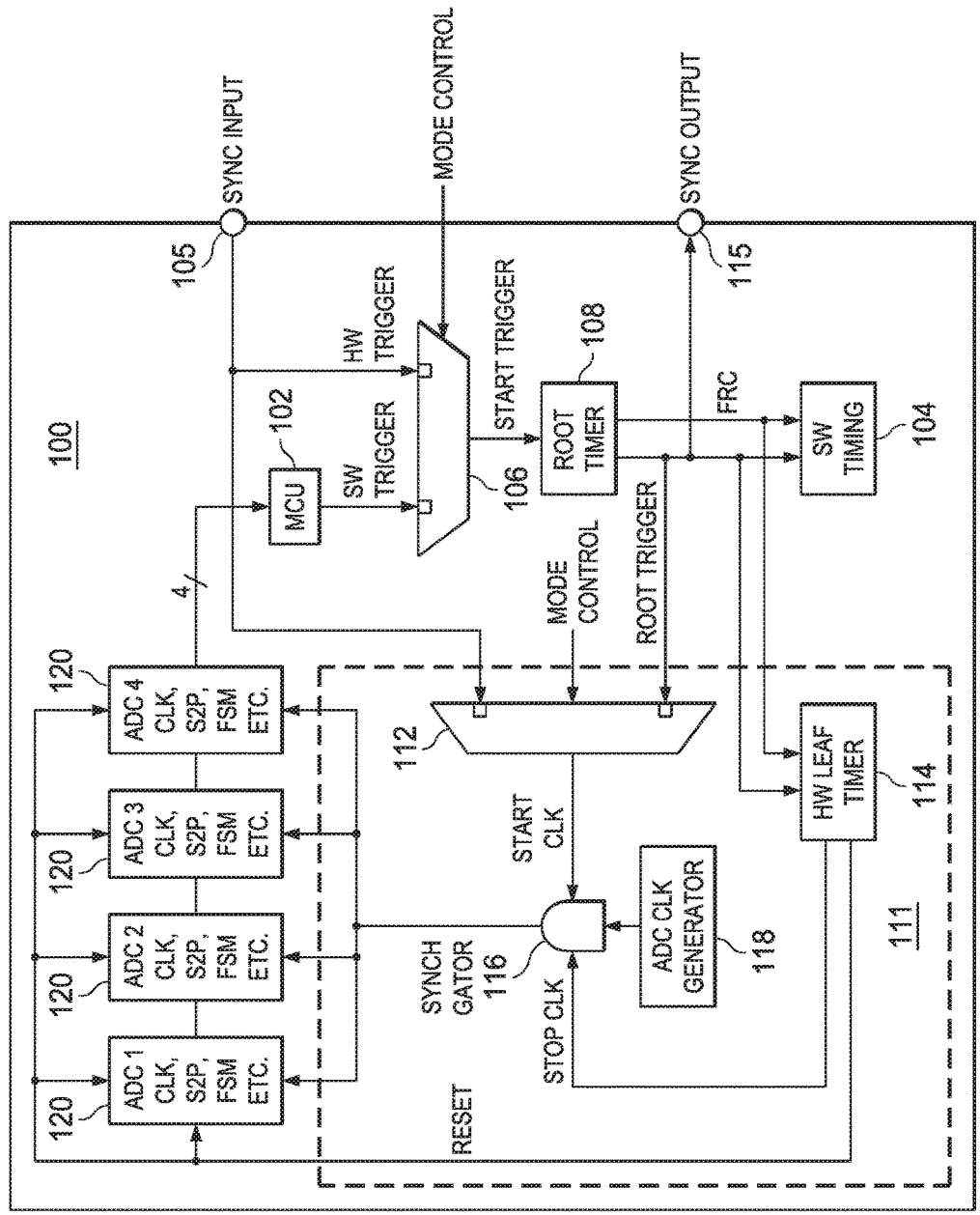
FIG. 4 illustrates a diagram for a radar IC chip.

FIG. 4 illustrates a component diagram of an example of a radar IC chip 100. The radar IC chip 100 can be employed to implement the IC chip 2 of FIG. 1. The radar IC chip 100 can include an MCU 102. The MCU 102 can be a microcontroller, such as a DSP. The MCU 102 can include machine executable instructions for processing timing functions. For purposes of simplification of explanation, a separate component labeled as a software timing 104 is illustrated as being external to the MCU 102. However, it is to be understood that the software timing 104 represents a software module (e.g., machine readable instructions) that is executing on the MCU 102.

The IC chip 2 can include a trigger selector 106 that can be implemented, for example, as a multiplexer. The triggers selector 106 can be configured to output a start trigger signal (labeled in FIG. 4 as "START TRIGGER") that is based on one of a software trigger (labeled in FIG. 4 as "SW TRIGGER") and a hardware trigger (labeled in FIG. 4 as "HW TRIGGER") that can be received at the trigger selector 106. The software trigger can be generated on chip and provided from the MCU 102. The hardware trigger (employed as a synchronization signal) can be provided from a synch input port 105 (labeled in FIG. 4 as "SYNCH INPUT"), which can be generated by the 100 chip (if in the master mode) or by another chip (if in the slave mode). The trigger selector 106 can select either the software trigger or the hardware trigger based on a mode control signal (labeled in FIG. 4 as "MODE CONTROL"). The mode control signal can be provided from the MCU 102 or an external source. Alternatively, in other examples, the mode control signal can be hardwired into the trigger selector 106. In still other examples, the trigger selector 106 can include internal logic for selecting the trigger selector 106 in response to detecting an event or condition associated with the chip or system in which the IC chip 2 is implemented.

The start trigger can be, for example, a frame pulse signal. As used herein, the term "frame pulse" denotes a pulsed signal with a clock edge at a start of each frame or a clock edge at a start of a predetermined number of frames. Thus, the start trigger can be a pulsed signal with a clock pulse indicating the start of a frame (e.g., approximately every 40 ms) or at the start of a predetermined number of frames. The start trigger can be provided to a root timer 108. In response to each pulse at the start trigger, the root timer 108 can generate a root trigger (e.g., a frame pulse) that also signifies the start of a frame. Accordingly, in some examples, the root trigger can be a passed through version of the start trigger. Alternatively, the root trigger can be a delayed version of the start trigger (e.g., delayed by one or more clock pulses). The root trigger can be output to a component of a hardware clock control 111. The components of the hardware clock control 111 can implement the hardware clock control 12 of FIG. 1.

As an example, root trigger can be provided to an input of a clock selector 112 of the hardware clock control 111. The clock selector 112 can output a start clock signal (labeled in FIG. 4 as "START CLK") corresponding to either the root trigger or a synchronization signal received at the synch input port 105 (explained herein). The clock selector 112 can be controlled by the mode control signal.

The root timer 108 can also provide a free running counter (FRC) signal (labeled in FIG. 4 as "FRC") to a hardware leaf timer module 114 of the hardware clock control 111. The hardware leaf timer module 114 represents a collection of hardware leaf timers, each of which generates one or more timing signals. The hardware leaf timer module 114 may generate several digital signals (the timing signals) through hardware leaf timers that control the timing of various activities in the radar IC chip 100. These activities can include enabling and disabling of various receiver, transmitter and/or LO circuits, starting and stopping of a ramp up or down of an LO output signal frequency, a starting of digital processing of ADC outputs, and the like. The hardware leaf timers can include circuit components that can generate timing signals and/or timing control signals that are synchronized based on the root trigger provided from the root timer 108. Similarly, the root timer 108 can provide the FRC signal to the software timing module 104 (of the MCU 102). Further, in some modes of operation, namely the master mode and the slave mode, the root timer 108 can output a synchronization signal (which could correspond to the hardware trigger signal) at a synch output port 115 (labeled in FIG. 4 as "SYNCH OUTPUT") of the radar IC chip 100. In some examples, the synchronization signal can be pulsed and each time the FRC reaches a predetermined value.

The clock selector 112 can provide the start clock signal to an input of a synchronization gator 116 of the hardware clock control 111. The synchronization gator 116 can also receive a clock stop signal (labeled in FIG. 4 as "STOP CLK") from the hardware leaf timer module 114 a predefined time after the frame pulse or synchronization signal. The synchronization gator 116 can receive a clock signal from an ADC clock generator 118 of the hardware clock control 111. The clock signal from the ADC clock generator 118 can have clock pulses at specific instances (e.g., about every 2-10 μs). The synchronization gator 116 is designed as a digital circuit containing logic gates and latches or flip flops which ensure that the input clock is forwarded to the output without any glitches.

The synchronization gator 116 can implemented as a digital circuit containing one or more digital logic gates and latches or flip flops. The synchronization gator 116 can configured to enable clock edges of the clock signal from the ADC clock generator 118 to be output at the output of the synchronization gator 116 at a time from the frame pulse initiated at the start clock until the stop clock signal is pulsed from the hardware leaf timer module 114. The enabling and disabling of the output clock is done in such a way to prevent glitches in the output clock at either time. The output of the synchronization gator 116 is coupled to each of the four (4) ADCs 120 and is used by a sampling clock and digital state machine clock by the ADCs 120 and components of the ADCs 120. Each of the ADCs 120 can be coupled to a respective receiver (e.g., the receiver 18 of FIG. 1). In some examples, the receiver may be external to the radar IC chip 100. In other examples, the receiver may be integrated within the radar IC chip 100. As noted, the synchronization gator 116 prevents glitches at the output. Accordingly, the hardware leaf timers that use the output of the synchronization gator 116 operate in such a way that the hardware leaf timers receive clock inputs for the duration in which the hardware leaf timers need to operate and the input clock of each hardware leaf timer is automatically gated at the end of that duration.

Figure 6:
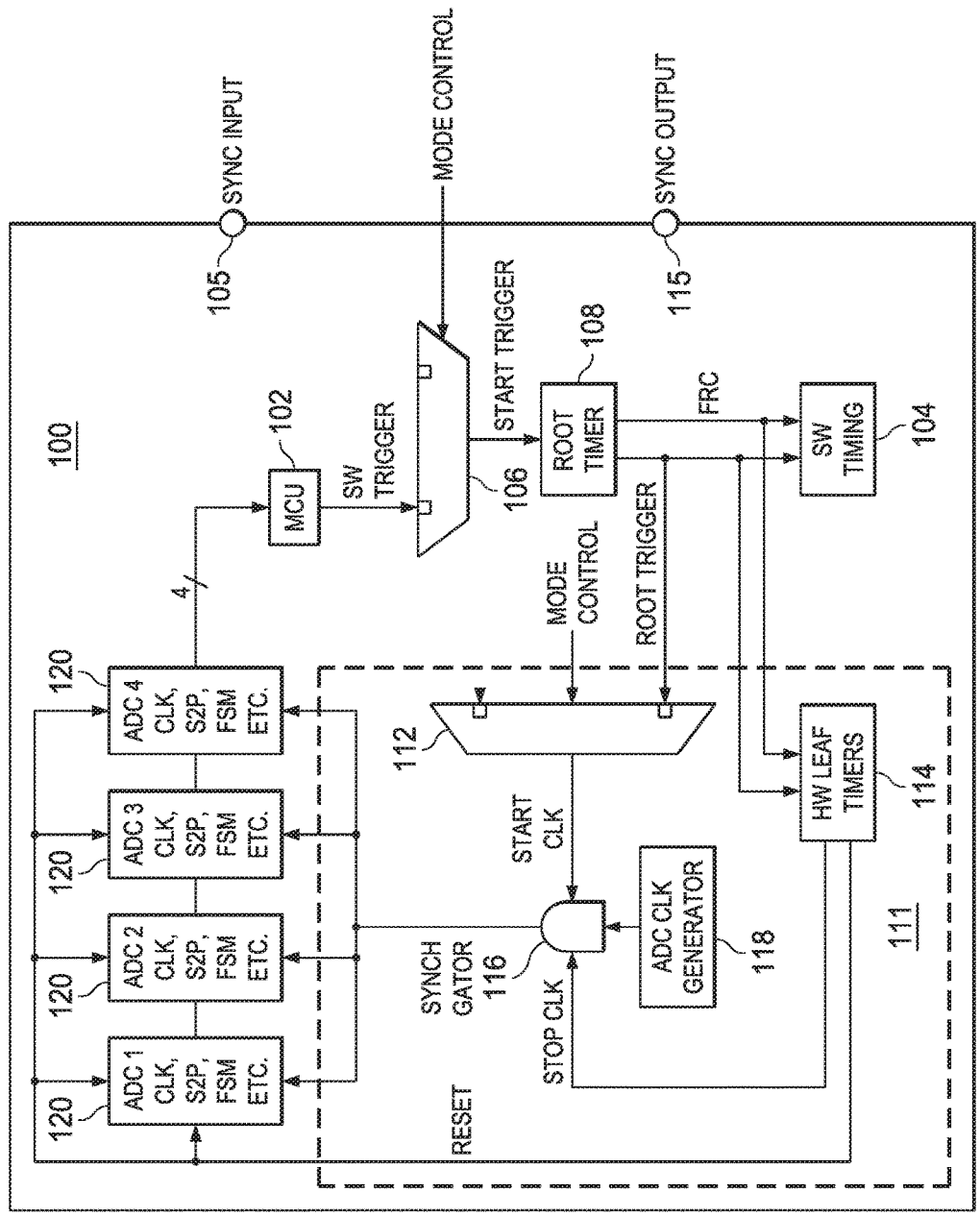
FIG. 6 illustrates a diagram of an example of a radar IC chip operating in single mode.
Figure 7:
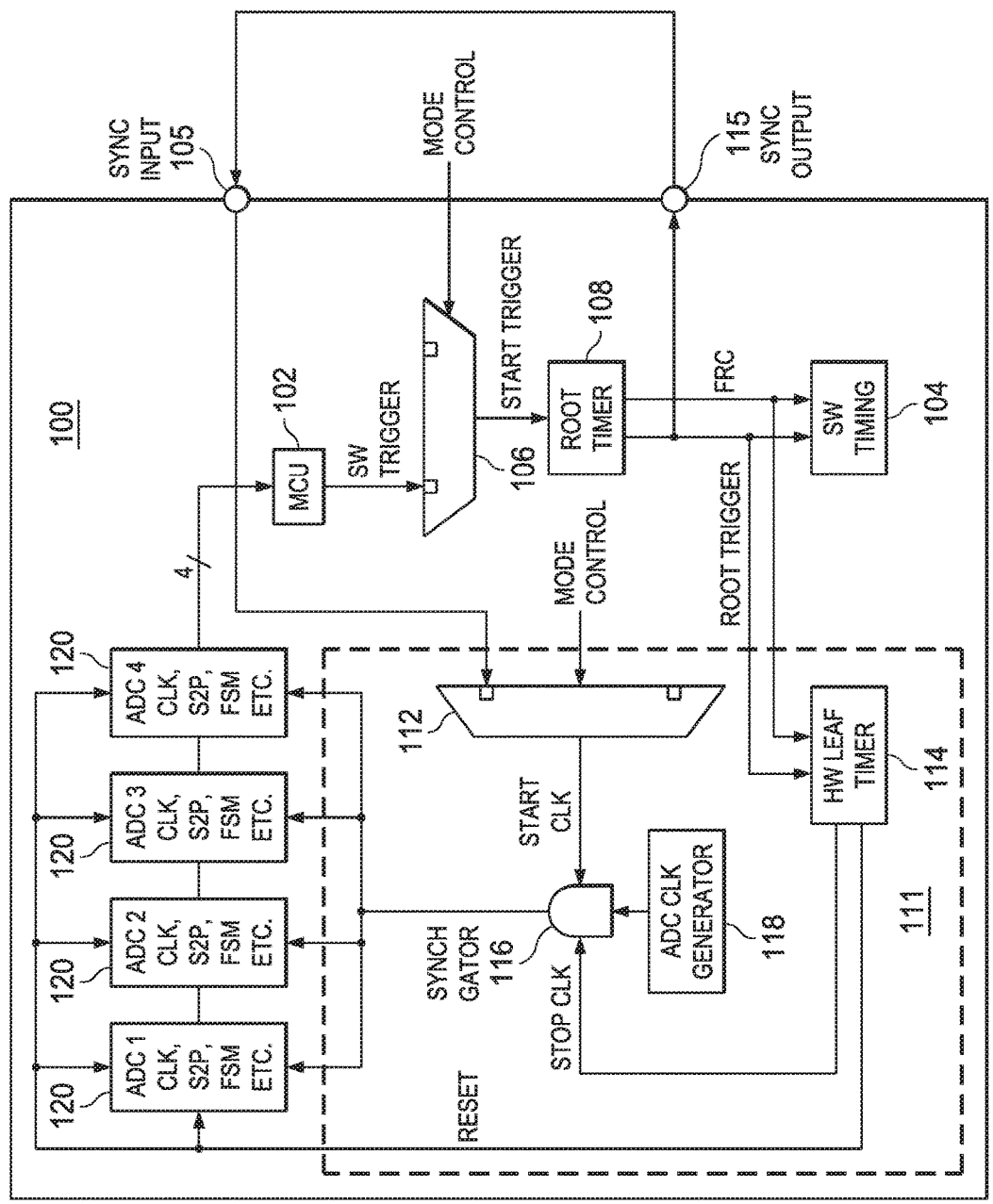
FIG. 7 illustrates a diagram of an example of a radar IC chip operating in master mode.
Figure 8:
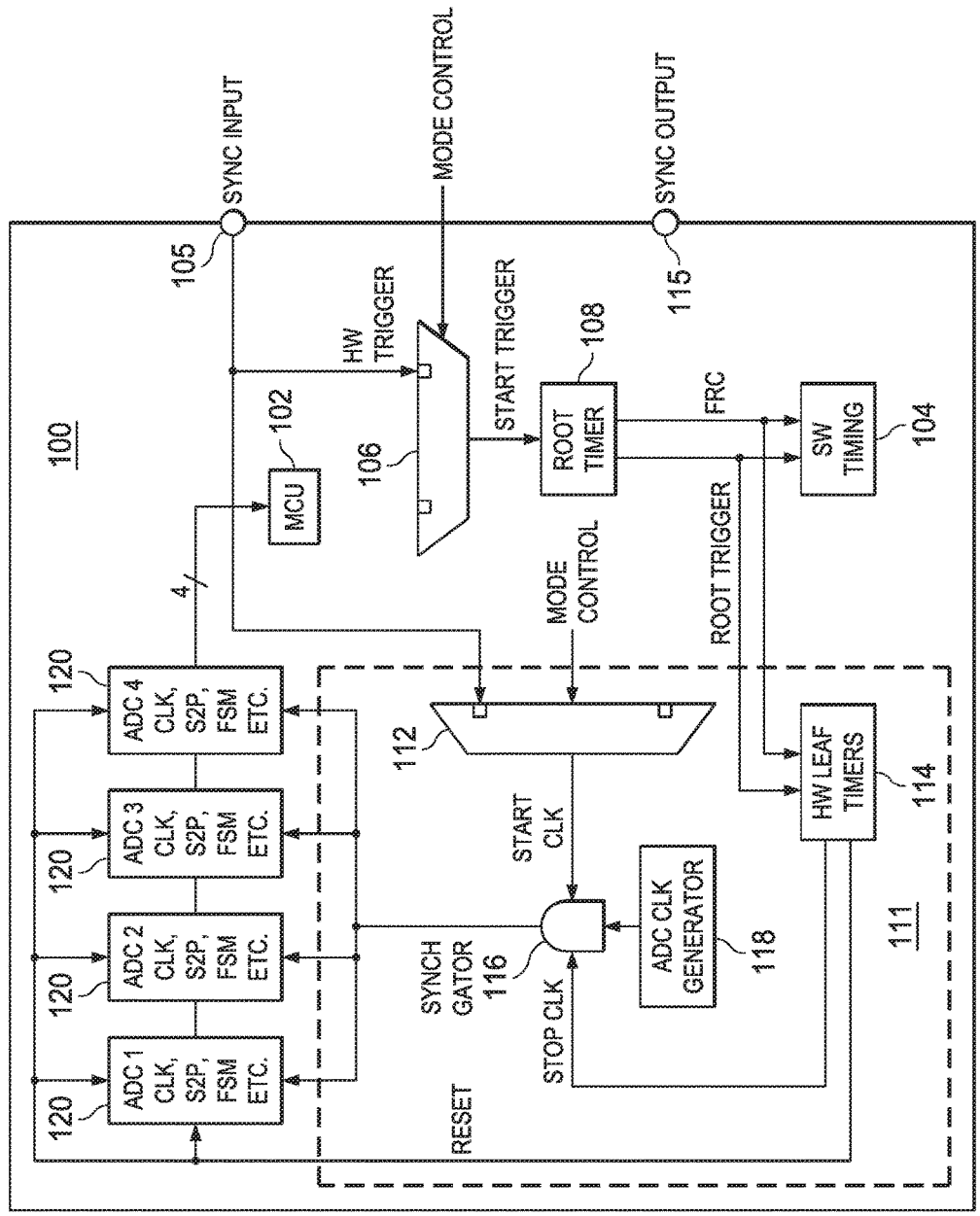
FIG. 8 illustrates a diagram of an example of a radar IC chip operating in slave mode.

For the purpose of simplification of explanation, many examples are generally explained in the description of this disclosure and in FIGS. 6-8, with the hardware leaf timer module 114, which contains several hardware leaf timers, receiving the FRC and root trigger directly from the root timer 108. However, there exist many examples where the hardware leaf timer module 114 or some of the hardware leaf timers of the hardware leaf timer module 114 receives the output clock of the synchronization gator 116, thereby getting indirectly synchronized to the root timer 108 through the synchronization gator 116. It allows tight synchronization, while the operation of other components still remains the same as explained in the examples described herein.

Each of the four ADCs 120 can include an internal clock, a serial to parallel (S2P) interface, a finite state machine (FSM) and/or other circuit components to enable sampling of an output of a respective receiver at a predetermined rate (e.g., 1.8 GHz). Each ADC 120 can include a sigma-delta modulator (SDM) that samples an output of a respective receiver in response to a signal pulse. In particular, each ADC 120 can be designed such that clock pulses at the output of the synchronization gator 116 can ungate the SDM of each ADC 120, thereby causing each of the ADCs 120 to sample the output of each respective receiver. The S2P interface can concatenate bits sampled by the respective ADC 120. Moreover, at specific time instances, a reset signal can be provided from the hardware leaf timer module 114 to reset each ADC 120. In this manner, the start clock signal generated by the ADC clock generator 118 is provided to the ADCs 120, such that the FSM and the S2P interface of each ADC 120 initiate a sampling cycle with an aligned phase.

The hardware leaf timers generated by the hardware leaf timer module 114 can also control operations on associated transmitters (e.g., the transmitters 16 of FIG. 1) and/or an LO (e.g., the LO 22 illustrated in FIG. 1). The transmitters and/or the LO can be internal or external to the radar IC chip 100. Further, the hardware leaf timers can control an order of operations in procedures such as DSP and/or a digital data path. In this manner, operations controlled by the hardware leaf timers generated by the hardware leaf timer module 114, including the sampling of the receiver outputs can be synchronized to a tight window.

The software timing module 104 can schedule operations such as calibration, BISTs, radar chirps, etc. Operations controlled by the software timing module 104 can be synchronized across a plurality of IC chips within a loose window.

As one example software operation, the sample RF signals can be provided to the MCU 102 from each of the ADCs 120. The MCU 102 can process the sampled RF signals in a radar chirp to derive data indicating a presence (or absence) of a detected object in an automotive detection system. In some examples, the MCU 102 can make a determination as to the location of the object. Additionally or alternatively, the MCU 102 can provide data to an external system (e.g., another radar IC chip or a radar controller) to collaborate data from multiple radar IC chips 100 to determine the location of the object for the automotive detection system. Furthermore, the radar controller (or other external system) can provide the MCU 102 with timing information that can control an order of operations of the software timing module 104 to avoid interference with other radar IC chips 100.

Figure 5:
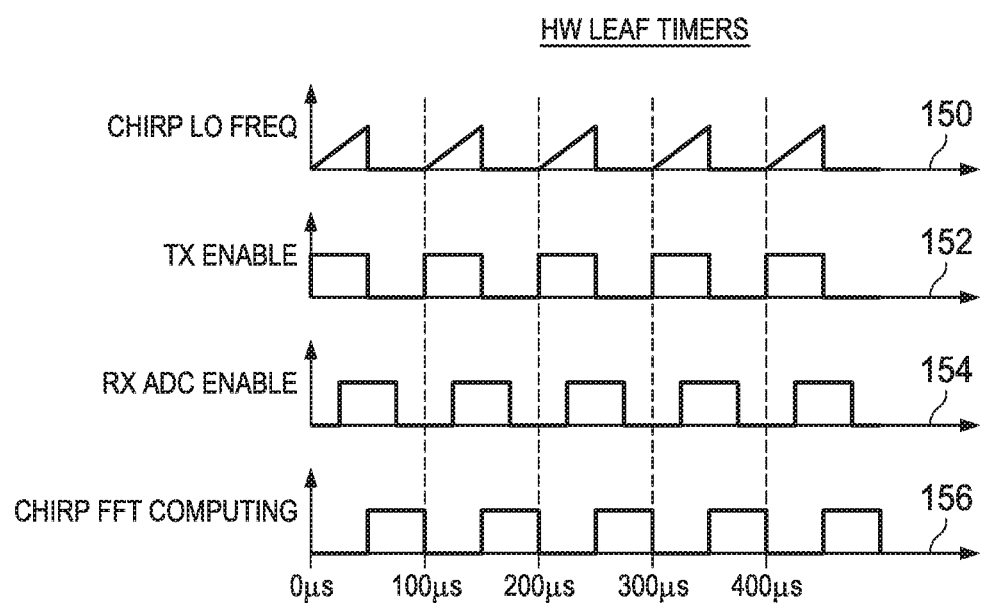
FIG. 5 illustrates a timing diagram of a radar IC chip.

FIG. 5 illustrates an example of timing charts 150, 152, 154 and 156 showing a set of hardware leaf timers output by the hardware leaf timer module 114. Each of the charts in FIG. 5 are scaled to the same frame of about 500 µs. In the timing chart 150, an LO chirp signal frequency (labeled in FIG. 5 as "CHIRP LO FREQ") is plotted as a function of time. In one example, the frequency of the LO chirp signal can range between 80 GHz and 81 GHz. In another example, the frequency of the LO chirp signal can range between 20 GHz and 21 GHz. In yet other examples, other frequencies could be employed. In the timing chart 152, a transmit signal (labeled in FIG. 5 as "TX ENABLE") voltage is plotted as a function of time. The transmit enable signal causes a transmitter to transmit a signal at a frequency corresponding to the LO chirp signal.

The timing chart 154 plots a voltage of a receiver ADC enable signal (corresponding to the complement of the stop clock signal) as a function of time. The receiver ADC enable signal causes the receiving ADC 120 to sample a corresponding receiver. Moreover, the timing chart 156 plots a voltage of a chirp Fast Fourier Transform (FFT) computing signal as a function of time. The chirp FFT computing signal causes the MCU 102 to read outputs of the ADCs 120, such as can be utilized (e.g., via digital signal processing) to calculate a location and/or distance of an object in an automotive detection system or other radar system. As illustrated by the timing charts 150-156, the hardware leaf timers generated by the hardware leaf timer module 114 can control operations of the radar IC chip 100 within a tight window. Moreover, it is noted that the list of example hardware leaf timers in FIG. 5 is not meant to be exhaustive. In some examples, the hardware leaf timers generated by the hardware leaf timer module 114 can additionally or alternatively control generation and/or transmission of a radar chirp, enabling and disabling a receiver circuit, and/or the initiation of nearly any radar operation.

Still further, the hardware leaf timer module 114 can generate hardware leaf timers that control signal generation aligned to radar chirps, such as (but not limited to) power control of transmitters and/or receivers. For example, the hardware leaf timers can cause the transmitters and/or the receivers to operate in a high performance, high power state during radar chirps and to operate in a low performance, low power state when a radar chirp ends.

As mentioned, the radar IC chip 100 can operate in single mode, master mode or slave mode based on the mode control signal. FIG. 6 illustrates an example of the radar chip 100 operating in the single mode. It is noted that the same terms and reference numbers are employed in FIGS. 4 and 6 to denote the same structure. Moreover, for purposes of simplification of explanation, some signals demonstrated in FIG. 4 are omitted from FIG. 6 to illustrate a signal flow in the single mode.

The mode control signal can be set to single mode such that the trigger selector 106 outputs the software trigger from the MCU 102 as the start trigger. Thus, the output of the root timer 108 is controlled by the MCU 102. Additionally, the clock selector 112 (in response to the mode control signal) selects the root trigger (a frame pulse) output by the root timer 108. Accordingly, the output of the synchronization gator 116 is controlled by the MCU 102. Moreover, in the single mode, the radar IC chip 100 does not need to synchronize with another radar IC chip. Thus, in the single mode, no external hardware trigger may be received, and no synchronization signal is needed to be provided. Accordingly, in single mode, the MCU 102 can control the sampling of the ADCs 120, the hardware leaf timers generated by the hardware leaf timer module 114 and the software timing module 104.

FIG. 7 illustrates an example of the radar chip 100 operating in the master mode that is coupled to another radar IC chip 100 operating in the slave mode. It is noted that the same terms and reference numbers are employed in FIGS. 4 and 7 to denote the same structure. Moreover, for purposes of simplification of explanation, some signals demonstrated in FIG. 4 are omitted from FIG. 7 to illustrate a signal flow in the master mode.

The mode control signal can be set to master mode such that the trigger selector 106 outputs the software trigger from the MCU 102 as the start trigger. Thus, the output of the root timer 108 is controlled by the MCU 102. The synchronization signal (a frame pulse) is output at the synch output port 115 by the root timer 108. In such a situation, the synchronization signal output by the root timer 108 operates at the root trigger signal. Moreover, the synchronization signal is fed back into the radar IC chip 100 at the synch input port 105 and coupled to the clock selector 112. The connection between input the synch input port 105 and the synch output port 115 can be an external connection between pins of the radar IC chip 100 or it may be implemented by an internal connection within the radar IC chip 100. In such a situation, a delay (e.g., switch and/or a timer) can be implemented in the internal connection to match a propagation delay to another radar IC chip 100 operating in slave mode.

Additionally, the synchronization signal received at the synch input port 105 is selected by the clock selector 112 (in response to the mode control signal). Accordingly, the output of the synchronization gator 116 is controlled by the MCU 102. Moreover, in the master mode, the synchronization signal would be provided to one or more slave radar IC chips. Thus, in the master mode, the MCU 102 can control the sampling of the ADCs 120 local to the radar IC chip, the hardware leaf timers generated by the hardware leaf timer module 114 and the software timing module 104.

FIG. 8 illustrates an example of the radar chip 100 operating in the slave mode, wherein the radar IC chip 100 is coupled to another radar IC chip operating in the master mode. It is noted that the same terms and reference numbers are employed in FIGS. 4, 7 and 8 to denote the same structure. Moreover, for purposes of simplification of explanation, some signals shown in FIG. 4 have been omitted from FIG. 8 to illustrate a signal flow in the slave mode.

In slave mode, a synchronization signal is received at the synch input port 105. The synchronization signal can be provided from the radar IC chip that is operating in the master mode and is provided to the trigger selector 106 as a hardware trigger (e.g., a frame pulse).

The mode control signal can be set to slave mode such that the trigger selector 106 outputs the hardware trigger from the MCU 102 as the start trigger. In response, the root timer 108 can restart the root trigger based on the start trigger, which start trigger is based on the synchronization signal generated by the IC chip operating in the master mode. In this manner, the hardware trigger re-syncs the root timer 108 of the radar IC chip 100 operating in the slave mode, such that the root timer 108 of the radar IC chip 100 operating in the slave mode is aligned with the root timer of the IC chip operating in the master mode. Thus, the output of the root timer 108 is controlled by the radar IC chip operating in the master mode. Such re-syncing can reduce timer drift over a period of time.

Additionally, the synchronization signal received at the synch input port 105 is selected by the clock selector (in response to the mode control signal). Accordingly, the output of the synchronization gator 116 is controlled by the radar IC chip operating in the master mode. Thus, in slave mode, the synchronization signal provided by the radar IC chip operating in the master mode can control the sampling of the ADCs 120, the hardware leaf timers generated by the hardware leaf timer module 114 and the software timing module 104 that are local to the radar IC chip 200 operating in the slave mode.

Since the root timer 108 of the radar chip 100 operating in the slave mode is synchronized with the root timer of the radar chip operating in the master mode (via the synchronization signal), the radar chip 100 operating in the slave mode and the radar chip operating in the master mode can synchronize calibration of components (e.g., transmitters and/or receivers), BISTs, monitoring and functional radar chirping activity among the various radar chips 100. Further, as illustrated in FIGS. 7 and 8 the synchronization signal is provided to the synch input port 105 in both the radar IC chip 100 (in FIG. 7) operating in the master mode and the radar IC chip 100 (in FIG. 8) operating in the slave mode to ensure a proper propagation delay match between the two radar IC chips.

As illustrated in FIGS. 4-8, the same radar IC chip 100 can operate in single mode, master mode or slave mode. Accordingly, in situations where multiple radar IC chips 100 are needed, the radar IC chip 100 operating in the master mode can control the overall timing for each of the connected radar IC chips 100. Moreover, in situations where only one radar IC chip 100 is needed, there is no need to redesign/fabricate a different radar IC chip 100.

Furthermore, software operations, such as the control of calibration and/or radar chirps can be performed on the MCU 102 of the radar IC chip 100, even in situations where the radar IC chip 100 is operating in the slave mode. This architecture distributes the processing load of such software operations among the MCUs 102 of each connected radar IC chip 100.

As shown and described with respect to FIGS. 4-8, hardware operations (including sampling of the ADCs 120) across multiple radar IC chips 100 can be synchronized in within a tight window. Software operations across multiple radar IC chips 100 that do not need such tight synchronization can be synchronized within a loose window. In this manner, in a multi-chip system, the same radar IC chip 100 can be employed to achieve two levels of synchronization (loose and tight) between the multiple radar IC chips 100. Moreover, since (as illustrated in FIGS. 7 and 8), the synchronization signal is common among each radar IC chip 100 there is no need to implement a handshaking procedure between a master radar IC chip 100 and one or more slave radar IC chips 100.

Figure 9:
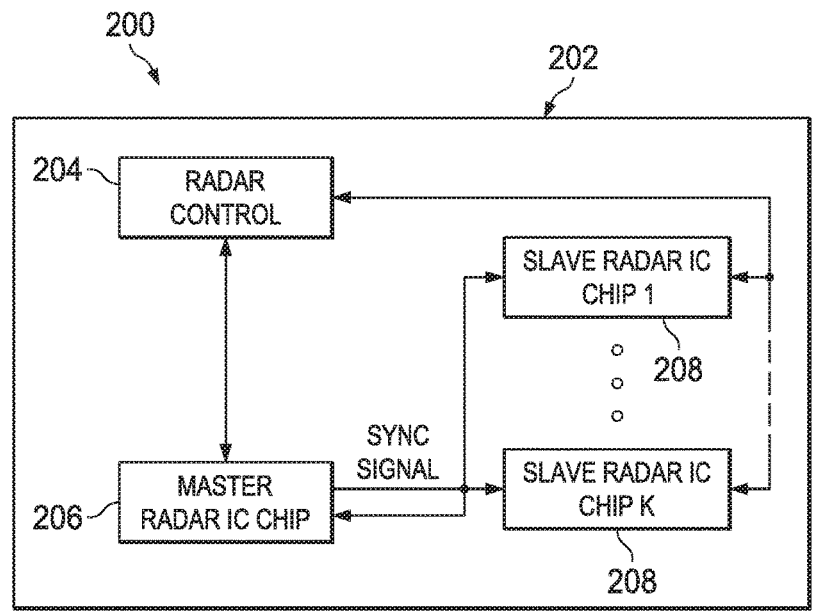
FIG. 9 illustrates an example of a radar system.

FIG. 9 illustrates an example of radar system 200 that can employ the radar IC chip 2 and/or the radar IC chip 100 illustrated in FIGS. 5-8. Components of the radar system 200 can be mounted on a printed circuit board (PCB) 202. The radar system 200 can be employed, for example, in an automotive detection system or other radar system. The radar system 200 can include a radar control 204 to process radar data from radar IC chips (e.g., from MCUs operating thereon). The radar control 204 can be implemented as a microcontroller or one or more processor cores that access a memory storing machine readable instructions.

The radar system 200 can also include a master radar IC chip 206 and K number of slave radar IC chips 208, where K is an integer greater than or equal to one. The master radar IC chip 206 can be implemented as a radar chip 2 illustrated in FIG. 1 and/or a radar IC chip 100 illustrated in FIGS. 5 and 7 operating in the master mode. Each of the K number of slave radar IC chips 208 can be implemented as an IC chip 2 illustrated in FIG. 1 and/or a radar IC chip 100 illustrated in FIGS. 5 and 8 operating in the slave mode. That is, the master radar IC chip 206 and each of the K number of slave radar IC chips 208 can be different instances of the same chip design. The mode of operation of the master radar IC chip 206 and the K number of slave radar IC chips 208 can be set based on respective local software configurations and/or based on IC chip pin configurations on the PCB 202.

The master radar IC chip 206 can generate a synchronization signal (e.g., a frame pulse, labeled in FIG. 9 as "SYNC SIGNAL") that is provided to each of the K number of slave radar IC chips 208 and fed back to the master radar IC chip 206. The synchronization signal can synchronize hardware operations (e.g., sampling of receivers) in a tight window and software operations (self-calibration, BISTs, radar chirps), etc. in a loose window among each of the master IC radar chip 206 and the K number of slave radar IC chips 208.

The radar control 204 can, for example, assign time windows (e.g., via time division multiplexing) to the master radar IC chip 206 and the slave radar IC chip 208 to perform certain software functions (e.g., alignment and/or BISTs). Based on the assigned time windows and the synchronization signal, the master radar IC chip 206 and each of the slave radar IC chips 208 can operate in concert to avoid mutual interference that may occur during alignment and/or BISTs.

Additionally, during operation, the master radar IC chip 206 and each of the slave radar IC chips 208 can provide the radar data to the radar control 204. The radar data can include data that can be collated and employed to determine a distance from an object and a direction of the object relative to the radar IC chip 2.

Moreover, the master radar IC chip 206 can synchronize the operations of the master radar IC chip 206 and the K number of slave radar IC chips 208 with only one signal that can (in some examples) be provided via a signal wire, such as a complementary metal oxide semiconductor (CMOS) signal wire.

One example can be explained in conjunction with FIGS. 4-9. The PCB 202 contains the radar system 200. The radar system 200 contains several radar IC chips, labeled as 206 and 208 in FIG. 9 and each is implemented as the radar IC chip 100 shown in FIG. 4. One of the radar control 204 and the radar IC chips 206 and 208 configure the properties of a radar frame into the radar IC chips 206 and 208. One of the radar IC chips, namely the radar IC chip 206, in FIG. 9, is configured to operate in the master mode and the remaining radar IC chips 208 are configured to operate in the slave mode.

In the master mode, the MCU 102 (illustrated in FIG. 4) of the master radar IC chip 206 generates a software trigger, which is a signal event that indicates to the radar system in 202 that a radar frame should occur. This event may be indicated in the form of a digital pulse, referred to as frame pulse as defined earlier. The trigger selector 106 (a multiplexer) in the master radar IC chip 206 forwards this software trigger to the root timer 108 (illustrated in FIG. 4), which starts counting time from the time of this event (the root timer 108 does so by counting how many edges of the system clock occur since this event). The software or firmware executing on the master radar IC in the MCU 102 (illustrated in FIG. 4) or other digital state machines triggers various radar operations when the root timer value reaches pre-defined values. The radar operations may include executing calibration or BIST of radar components or even radar chirps or frames. The radar operations may also include the generation of one or more subsequent software triggers by the root timer 108 on behalf of the MCU 102. The frame pulse generated by the root timer 108 is also sent to a clock selector 112 (a multiplexer) which is configured to forward the frame pulse to the synchronization gator 116.

The synchronization gator 116 can be implemented as a set of one or more digital logic gates and flip flops. The synchronization gator 116 enables clock edges of the clock signal from the ADC clock generator 118 to be simultaneously (or nearly simultaneously) output to ADCs 1-4 120 (illustrated in FIG. 4) at a time from the frame pulse until the stop clock signal is pulsed from the hardware leaf timer module 114. This ensures that each of the ADCs 1-4 120 sample their respective receiver outputs within a tight window so that the determination of direction of object directions using the ADC outputs is accurate.

The root timer 108 also controls the timing of more counters in the master radar IC chip 206, collectively represented by hardware leaf timer module 114 illustrated in FIG. 4. The hardware leaf timer module 114 can generate several digital signals through hardware leaf timers. The digital signals can control the timing of various activities in the master radar IC chip 206, such as enabling and disabling of various RX/TX/LO circuits, starting and stopping of ramp up or down of LO output signal frequency, starting of digital processing of ADC outputs and the like.

The operation of one of the slave radar IC chips 208 is explained and the other slave radar IC chips 208 operate similarly. The frame pulse generated by the root timer 108 of master radar IC chip 206 is also forwarded (as the synchronization signal) to the synchronization gator 116 and root timer 108 of slave radar IC chips 208 through appropriate configuration of the clock selector 112 and the trigger selector 106, respectively, in the slave radar IC chip 208. Upon receiving the frame pulse, the root timer 108 of the slave radar IC chip 208 resets itself to be in alignment with the root timer 108 of the master radar IC chip 206 (alignment may mean same value or a value of a known difference). The rest of the operation of the components in the slave radar IC chip 208 are the same as the master radar IC chip 206. This ensures that the ADCs 1-4 120 of master radar IC chip 206 and the ADCs 1-4 120 slave radar IC chip 208 sample their RX outputs simultaneously (or nearly simultaneously) so that the determination of direction of object directions using the ADC outputs is accurate. The presence of more ADCs 120 in the combined master-slave system than in a system with only one radar IC chip provides improved object position determination capability. Additionally, this ensures that the hardware leaf timers in the master radar IC chip 206 and the and slave radar IC chips 208 operate in tight window synchronization.

In one example, the PCB 202 contains only the slave radar IC chips 208 and the function of generation of software trigger or frame pulse is executed by a microcontroller running in the radar control 204 instead of the MCU 102 in master radar IC chip 206. In such a situation, the software trigger or frame pulse is communicated to all the slave radar IC chips 208 and the rest of the operation is similar to that described in the previous example.

Figure 10:
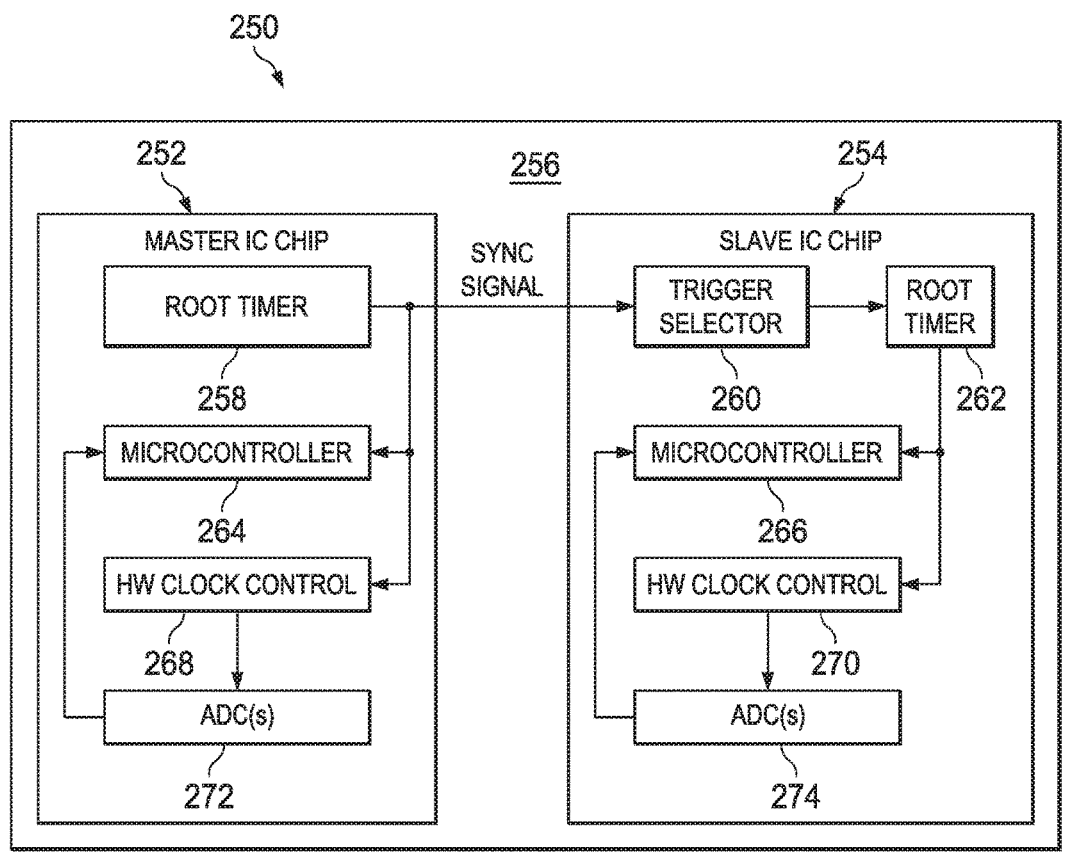
FIG. 10 illustrates another example of a radar system.

FIG. 10 illustrates another example of a radar system 250. The radar system 250 can include a master IC chip 252 and a slave IC chip 254. The master IC chip 252 can be implemented as an instance of the radar IC chip 100 of FIG. 4 operating in the master mode. Similarly, the slave IC chip 254 can be implemented as an instance of the radar IC chip 100 of FIG. 4 operating in the slave mode. Thus, as explained herein, each of the master IC chip 252 and the slave IC chip 254 can be implemented as different instances of the same IC chip design. Each of the master IC chip 252 and the slave IC chip 254 can be mounted on a PCB 256. Moreover, the mode of operation of each of the master IC chip 252 and the slave IC chip 254 can be set, for example by a software configuration and/or IC chip pin configuration on the PCB 256.

The master IC chip 252 can include a root timer 258 that can generate a synchronization signal (labeled in FIG. 10 as "SYNC SIGNAL") that is provided to a trigger selector 260 of the slave IC chip 254. The synchronization signal can be a frame pulse signal that provides a clock edge at the start of each frame or the start of a set of frames. The trigger selector 260 can forward the synchronization signal as a start trigger signal to a root timer 262 of the slave IC chip 254. In response to each frame pulse in the start trigger (corresponding to the synchronization signal), the root timer 262 can restart/reset a root trigger, such that the root trigger is aligned with the synchronization signal.

Each of the master IC chip 252 and the slave IC chip 254 can include a microcontroller (a processor) 264 and 266 for executing radar operations with timing controlled directly or indirectly by the synchronization signal. The radar operations can include, but are not limited to the trigger of radar chirps, the scheduling and execution of BISTs, the calibration of RF receiver and RF transmitter circuits that could be local or external to each of the master IC chip 252 and the slave IC chip 254, etc. Moreover, the microcontrollers 264 and 266 can be employed to execute nearly any software operation that relies on mutual alignment between the master IC chip 252 and the slave IC Chip 254.

Each of the master IC chip 252 and the slave IC chip 254 can include a hardware clock control 268 and 270. The hardware clock control 268 can generate leaf timers for the master IC chip 252 based on the synchronization signal. Similarly, the hardware clock control 270 can generate leaf timers for the slave IC chip 254 based on the root trigger from the root timer 262, which root trigger is based on the synchronization signal. Moreover, based on the synchronization signal, the hardware clock control 268 can enable clock edges to control sampling instances of an analog input of more ADCs 272 of the master IC chip 252, and data characterizing the samples can be output to the master controller 264. Similarly, based on the root trigger signal (which is based on the synchronization signal), the hardware clock control 270 can enable clock edges to control sampling instances of an analog input of one or more ADCs 274 of the slave IC chip 254, and the data characterizing the samples can be output to the microcontroller 266.

Moreover, the hardware leaf timers generated by the hardware clock control 268 and 270 can be employed for a variety of different operations that need mutual alignment between the master IC chip 252 and the slave IC chip 254. Such operations can include, but are not limited to enabling/disabling of various RF receiving and/or RF transmitter circuits (or other circuits). Such operations can also include an initiation of nearly any radar operation, such as radar chirp frequency generation, generation/transmission of a chirp, digital processing of ADC outputs (by the microcontroller 264 and 266 or an external circuit) and/or signal generation aligned to the radar chirps, such as power control of RF transmission and/or RF receiving circuits. For example, the power control can set the RF transmission and/or RF receiving circuits to a high performance, high power state during radar chirps and a low performance, low power state after the radar chirp ends.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. An integrated circuit (IC) chip comprising:
   a synchronization input;
   a root timer that generates a frame pulse based on a start trigger signal;
   a hardware clock control that provides a clock signal based on a selected one of the frame pulse and a synchronization signal provided from one of the root timer and another IC chip, the hardware clock control including:
   a clock selector having a first input coupled to an output of the root timer, a second input coupled to the synchronization input of the IC chip, and an output; and
   circuitry having an input coupled to the output of the clock selector and having an output configured to output the clock signal, the IC chip further comprising:
   a plurality of analog to digital converters (ADCs) coupled to the output of the circuitry in the hardware clock control, each of the plurality of ADCs being configured to sample an output of a respective one of a plurality of radio frequency (RF) receivers based on the clock signal.

2. The IC chip of claim 1, further comprising:
   a microcontroller that controls a timing of software operations based on the frame pulse provided from the root timer, wherein operations controlled by the clock signal provided by the hardware clock control are synchronized within a tight window and the software operations are synchronized within a loose window.

3. The IC chip of claim 2, wherein the software operations include one or more of a calibration and a built-in self-test (BIST) for one or more of a plurality of RF transmitters and the plurality of RF receivers.

4. The IC chip of claim 3, wherein the software operations further include a radar chirp.

5. The IC chip of claim 1, wherein the root timer generates the synchronization signal and the synchronization signal is provided to a synchronization output terminal of the IC chip.

6. The IC chip of claim 5, further comprising:
   a trigger selector that selects the synchronization signal to provide the start trigger signal, wherein the synchronization signal is fed back to a synchronization input of the IC chip that is coupled to an input of the hardware clock control.

7. The IC chip of claim 1,
wherein the clock selector selects between the frame pulse and the synchronization signal to generate a start clock signal, and wherein the hardware clock control further includes:
an ADC clock generator that generates the clock signal of the hardware clock control for the plurality of ADCs;
a hardware leaf timer that generates a stop clock signal based on the frame pulse; and
a synchronization gator that outputs the clock signal based on the start clock signal from the clock selector and the stop clock signal from the hardware leaf timer.

8. The IC chip of claim 7, wherein the synchronization gator comprises one or more digital logic gates, and the one or more digital logic gates output the clock signal from the ADC clock generator to the ADCs based on the start clock signal and the stop clock signal.

9. The IC chip of claim 7, further comprising:
a trigger selector that selects between the synchronization signal and the software trigger to provide the start trigger signal;
wherein the clock selector and the trigger selector are controlled based on a mode selection signal that sets a mode of operation of the IC chip.

10. The IC chip of claim 9, wherein the mode of operation of the IC chip is one of a single mode, a master mode and a slave mode.

11. The IC chip of claim 10, wherein in response to the IC chip operating in the slave mode, the trigger selector selects the synchronization signal received from another IC chip and provides the synchronization signal as the start trigger.

12. The IC chip of claim 1, further comprising a microcontroller that analyzes data output by each of the plurality of ADCs to facilitate detection of an object.

13. The IC chip of claim 1, further comprising:
a plurality of transmitters that output RF signals; and
a plurality of receivers, wherein the hardware clock control provides the clock signal to control operation of each of the transmitters and receivers.

14. The IC chip of claim 13, wherein the hardware clock control comprises:
a hardware leaf timer that controls the timing of at least one of enabling and disabling the plurality of transmitters and the plurality of receivers, a radar chirp frequency generation and/or transmission, signal generation aligned to radar chirps and digital processing of the output of the plurality of ADCs.

15. An integrated circuit (IC) chip comprising:
a microcontroller that generates a software trigger signal;
a trigger selector that receives the software trigger signal and selects the software trigger signal to provide a start trigger signal;
a root timer that generates a synchronization signal based on the start trigger signal, wherein the synchronization signal is provided to a synchronization output port of the IC chip that is coupled to a synchronization input port of the IC chip;
a hardware clock control that provides a clock signal based on the synchronization signal received at the synchronization input port; and
a plurality of analog to digital converters (ADCs) that are each configured to sample an output of a respective one of a plurality of receivers based on the clock signal.

16. The IC chip of claim 15, wherein the hardware clock control comprises:
a clock selector that selects the synchronization signal to generate a start clock signal;
an ADC clock generator that generates the clock signal of the hardware clock control for the plurality of ADCs;
a hardware leaf timer that generates a stop clock signal; and
a synchronization gator that outputs the clock signal based on the start clock signal and the stop clock signal.

17. The IC chip of claim 16, wherein the microcontroller executes radar software operations based on a frame pulse generated by the root timer.

18. A system comprising:
a controller that processes radar data to determine a location of an object;
a master integrated circuit (IC) chip, the master IC chip being configured to:
sample a plurality of received RF signals at predetermined instances, wherein a timing of the sampling performed by the master IC chip is based on a synchronization signal generated by the master IC chip;
perform a plurality of software operations based on timing corresponding to the synchronization signal; and
one or more slave IC chips, each of the one or more slave IC chip being configured to:
sample a plurality of received RF signals at predetermined instances, wherein a timing of the sampling performed by the respective slave IC chip is based on the synchronization signal generated by the master IC chip;
perform a plurality of software operations based on timing corresponding to the synchronization signal.

19. The system of claim 18, wherein the master IC chip and each of the one or more slave IC chips have the same circuit design.

20. The system of claim 18, wherein the predefined instances of the sampling by the master IC chip and the predefined instances of the sampling by one or more slave IC chips are synchronized to within 4 nanoseconds of each other.

21. The system of claim 18, wherein each of the master IC chip and the one or more slave IC chips comprises a hardware clock control module that enables clock edges for one or more analog-to-digital converters (ADCs) to facilitate the sampling at the predetermined instances.

* * * * *